(12) United States Patent
Mitzlaff

(10) Patent No.: US 7,091,781 B2
(45) Date of Patent: Aug. 15, 2006

(54) WIDEBAND FEED FORWARD LINEAR POWER AMPLIFIER

(75) Inventor: James E. Mitzlaff, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 42 days.

(21) Appl. No.: 10/977,455

(22) Filed: Oct. 29, 2004

(65) Prior Publication Data

US 2006/0091946 A1 May 4, 2006

(51) Int. Cl.
*H03F 1/26* (2006.01)

(52) U.S. Cl. .................. 330/149; 330/151; 330/52

(58) Field of Classification Search ............ 330/149, 330/151, 52
See application file for complete search history.

(56) References Cited

U.S. PATENT DOCUMENTS

| | | | |
|---|---|---|---|
| 3,541,467 A | 11/1970 | Seidel | |
| 3,667,065 A | 5/1972 | Beurrier et al. | |
| 4,743,859 A | 5/1988 | Sosin | |
| 4,926,136 A | 5/1990 | Oliver | |
| 5,065,110 A | 11/1991 | Ludvik et al. | |
| 5,444,418 A | 8/1995 | Mitzlaff | |
| 6,208,207 B1 | 3/2001 | Cavers | |
| 6,545,487 B1* | 4/2003 | Ly | 324/620 |
| 6,801,083 B1* | 10/2004 | Ishigami et al. | 330/52 |
| 6,838,934 B1* | 1/2005 | Suzuki et al. | 330/52 |
| 6,946,906 B1* | 9/2005 | Rabinovich et al. | 330/52 |

* cited by examiner

*Primary Examiner*—Patricia Nguyen

(57) ABSTRACT

A circuit is provided, having a feed forward linear power amplifier configured with two or more error correction loops (225–235, 255–265). Each of the error correction loops includes a band pass filter (237, 257). Each of the band pass filters (237, 257) is tuned to a different frequency range. A controllable frequency oscillator (220) can be coupled to an input of the error correction loops. A controller sweeps the frequency of the controllable frequency oscillator over the frequency range corresponding to each of the band pass filters (237, 257).

20 Claims, 3 Drawing Sheets

WIDEBAND FEED FORWARD LINEAR POWER AMPLIFIER

FIELD OF THE INVENTION

The present invention relates in general to linear power amplifiers, and more specifically to a wideband linear power amplifier using feed forward linearizing techniques.

BACKGROUND OF THE INVENTION

In a high power, ultra wideband ("UWB") feed forward linear power amplifier ("FFLPA"), it may not be economical to obtain components which cover the full bandwidth required of the FFLPA. This is especially true for an error correction path, which must operate over a wider bandwidth than the FFLPA, in order to remove distortion products that may fall outside an operating bandwidth of the FFLPA. In such configurations, therefore, there tends to be an inability to obtain a sufficient error correction bandwidth in a very wide bandwidth FFLPA, for example, where the linear power amplifier ("LPA") bandwidth equals the maximum practical error amplifier bandwidth.

Known devices include a "dual loop" FFLPA, in which two error correction loops are tuned and aligned to operate across the same frequency range. This approach may provide enhanced error correction. However, it can limit the operating bandwidth of the FFLPA to about half the bandwidth of each error correction path. If this approach is utilized, an octave bandwidth FFLPA (for example) would require an error correction path having about a two octave bandwidth.

Multiple octave power amplifiers are known, but tend to be inefficient and hence generally utilized in laboratory and cost-insensitive military applications.

BRIEF DESCRIPTION OF THE DRAWINGS

The accompanying figures where like reference numerals refer to identical or functionally similar elements and which together with the detailed description below are incorporated in and form part of the specification, serve to further illustrate exemplary embodiments and to explain various principles and advantages in accordance with the present invention.

DETAILED DESCRIPTION

In overview, the present disclosure concerns amplifiers associated with a communication system such as an Enterprise Network, a cellular Radio Access Network, or the like. Such communication systems may further provide services such as voice and data communications services. More particularly, various inventive concepts and principles are embodied in amplifiers, systems, and methods therein for providing a feed forward linear power amplifier enabling error correction over a wide bandwidth.

The communication systems of particular interest are those providing or facilitating voice communications services or data or messaging services over cellular wide area networks (WANs), such as conventional two way systems and devices, various cellular telephone communication systems including analog and digital cellular, CDMA (code division multiple access) and variants thereof, GSM (Global System for Mobile Communications), GPRS (General Packet Radio System), 2.5G and 3G systems such as UMTS (Universal Mobile Telecommunication Service) systems, Internet Protocol (IP) Wireless Wide Area Networks like 802.16, 802.20 or Flarion, integrated digital enhanced networks and variants or evolutions thereof or the like.

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Figure 1:
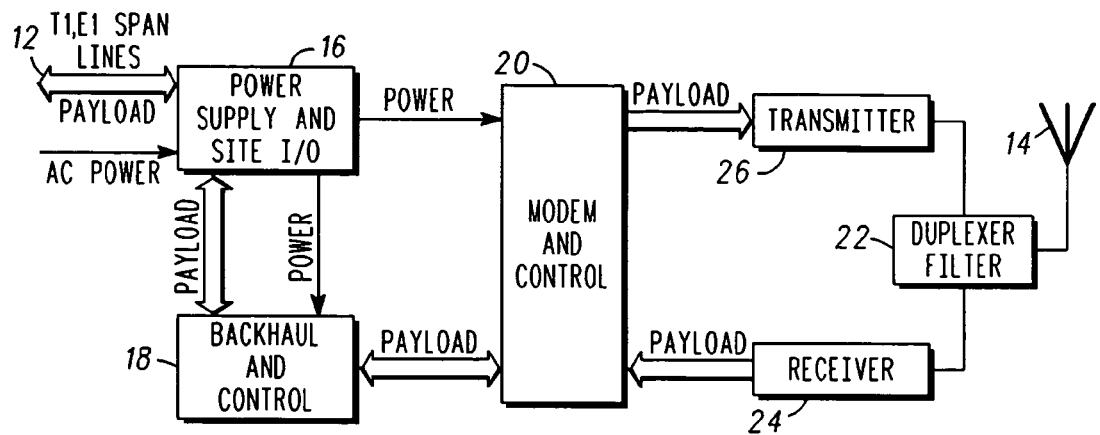
FIG. 1 is a block diagram illustrating an exemplary wireless communications base station in which one or more embodiments of a power amplifier circuit can be implemented.

FIG. 1 shows an exemplary wireless communications base station (base station) 10 in which one or more embodiments of a power amplifier circuit can be implemented. While the actual structural makeup of such a base station can vary, the base station 10 will be referred to for purposes of discussing an exemplary environment in which various embodiments of a power amplifier circuit can be implemented. As is well known, the base station 10 can be generally coupled to a landline link such as, for example, T1 or E1 span lines 12 that can enable the base station 10 to connect wireless communications received by a base station antenna 14 to the public switch (not shown) and vice versa. The base station 10 generally can include a power supply for converting AC power to and providing appropriate DC power to the various elements of the base station and a site input/output processor 16 represented in the illustration for facilitating input/output with a backhaul and control computer 18. The backhaul and control computer 18 can be utilized in connection with controlling and processing communications over the span lines 12 as well as processing communications over and controlling operation of a modem and control computer 20. The modem and control computer 20 can be utilized in connection with facilitating receipt, transmission and processing of communications signals from a base station receiver 24 and for a base station transmitter 26 that can be inter-coupled through a duplexer 22 to the base station antenna 14. The base station transmitter 26 can include, implement, and/or utilize a one or more embodiments of a power amplifier circuit.

Some of the inventive functionality and the inventive principles when implemented, can be supported with or in software or integrated circuits (ICs), such as a digital signal processor and software therefore or application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions or ICs with minimal experimentation. Therefore, in the interest of brevity and minimization of any risk of obscuring the principles and concepts according to the present invention, further discussion of such software and ICs, if any, will be limited to the essentials with respect to the principles and concepts used by one or more exemplary embodiments.

As further discussed herein below, various inventive principles and combinations thereof are advantageously employed to cover the full bandwidth for a feed forward linear power amplifier.

Further in accordance with exemplary embodiments, there is provided a modified dual loop or multiple loop feed forward linear power amplifier system, where an error amplifier of each loop together have the same bandwidth as a main amplifier. In a dual loop system, advantageously one error amplifier loop can be tuned to have a center frequency near an upper edge of a main amplifier pass band, and the other error amplifier loop can be tuned to have a center frequency near a lower edge of the main amplifier pass band.

Accordingly, one or more embodiments provides that a conventional dual loop error amplifier can be modified to utilize a feed forward tuning process having cancellation adjustments for the respective error cancellation loops performed over a pass band of the error amplifier in that loop.

Figure 2:
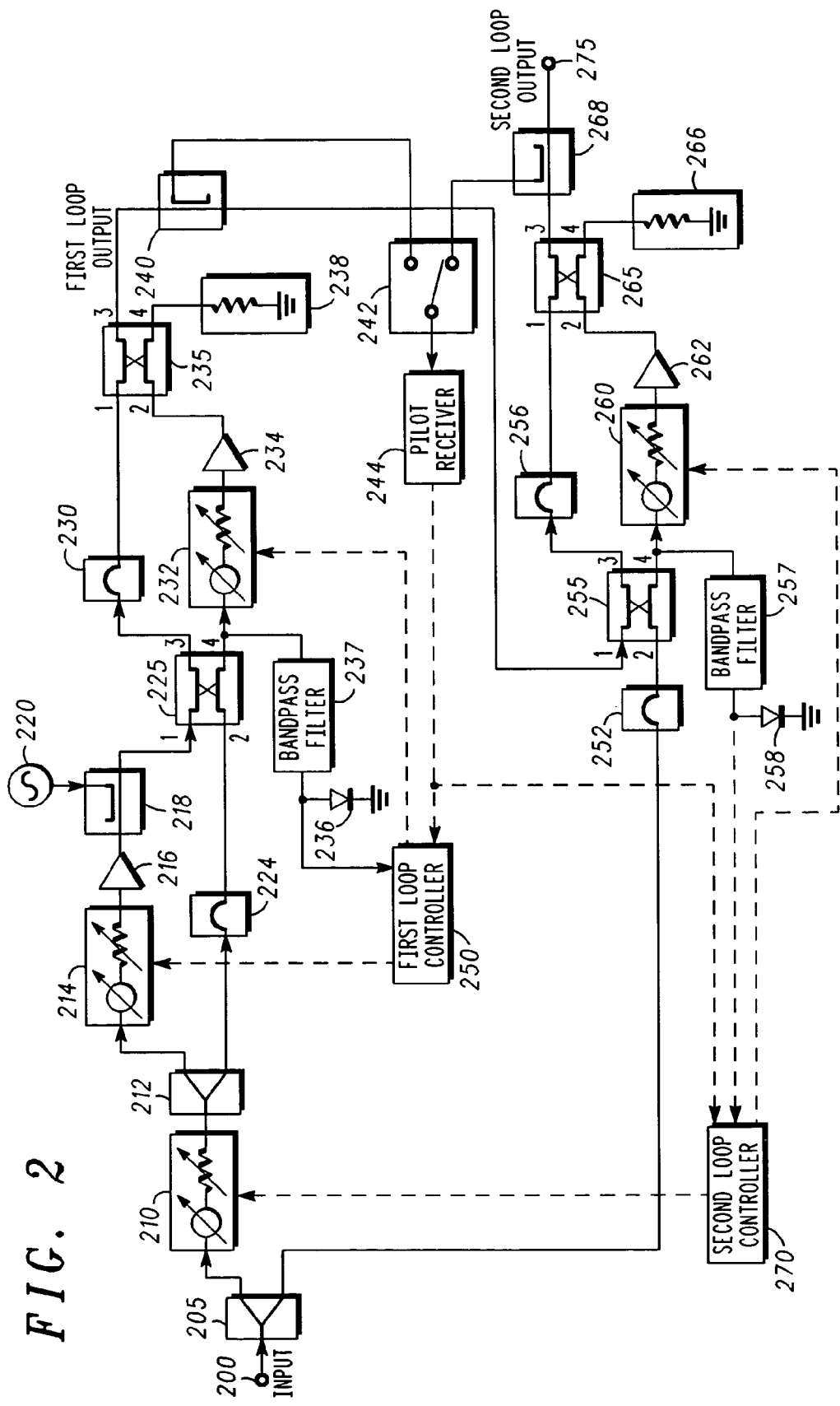
FIG. 2 is a block diagram illustrating an exemplary feed forward linear power amplifier in accordance with one or more exemplary embodiments.

Referring now to FIG. 2, an exemplary feed forward linear power amplifier in accordance with one or more exemplary embodiments will be discussed and described. An input signal 200 is provided to a first splitter circuit 205, which further splits the input signal and provides the input signal 200 to two or more loops of a feed forward amplifier. In the present example, the feed forward amplifier is a dual loop feed forward linear power amplifier including a first loop and a second loop. However, it is anticipated that the principles explained herein can be applied to other multi-loop embodiments.

In the first loop, the input signal 200 from the first splitter circuit 205 can be gain and phase adjusted through a first gain/phase control 210, and further split via a second splitter circuit 212 into first and second signal paths. The signal on the first signal path from the second splitter circuit 212 can be gain and phase adjusted via a second gain/phase control 214, amplified by a first amplifier 216. The first amplifier 216 can function as the main amplifier.

The signal on the first signal path can then be provided with a pilot tone from a controllable frequency oscillator 220 which is the source of a pilot tone, coupled via a first coupler 218 to an input of the first error correction loop. The controllable frequency oscillator 220 can be operated continuously, although in accordance with alternative embodiments it can be operated periodically, e.g., to perform a training cycle as desired. The signal on the second signal path can be delayed via a first delay 224. The signals on the first signal path and the second signal path then can be joined at a first inter-loop coupler 225. A signal on a first output path (via a port 3 of the first inter-loop coupler 225) can be delayed via a second delay 230, then fed into first output combiner 235. A signal on a second output path (via a port 4 of the first inter-loop coupler 225) can be gain and phase adjusted by a third gain/phase control 232 and amplified with a second amplifier 234 for amplifying errors in the signal. The second gain/phase control 214 can be adjusted to minimize carrier power delivered to the second amplifier 234. The signal on the second output path then can be combined with the signal on the first output path in a second combiner 235. Finally, a third output path (via port 3) of the second combiner 235 can provide an output signal corresponding to the first loop.

The output signal of the first loop can be connected to the second loop, and can be coupled to a pilot signal receiver 244 via a first loop output sampler 240 and a first switch 242. The third gain/phase control 232 can be adjusted to minimize the pilot signal at the output of the first switch 242. The fourth output path (via port 4) of the second combiner 235 can be coupled to a first dump load 238. A first band pass filter ("BPF") 237 can be connected to a third output path (via port 4) of the first combiner, further connected to a first detector 236, and input to a first loop controller 250. An appropriate band pass filter can be, for example, a fixed tuned filter.

In the second loop, the input signal from the first splitter circuit 205 can be delayed via a third delay 252 and then coupled with the output signal corresponding to the first loop via a second inter-loop coupler 255. A fourth output path of the second inter-loop coupler 255 (via port 3), specifically a signal thereon, can be delayed by a fourth delay 256. A signal from a fifth output path (via port 4) of the second inter-loop coupler 255 can be coupled to bandpass filter 257 and gain and phase adjusted via a fourth gain/phase control 260, and amplified by a third amplifier 262 for amplifying errors in the signal. The first gain/phase control 210 can be adjusted to minimize carrier power delivered to the third amplifier 262 in a pass band of the second loop. Both the fourth output path and the fifth output path are coupled to and signals thereon are combined at a fourth output combiner 265. A sixth output path (via port 3) from the fourth output combiner 265 and corresponding signal can be coupled to a feed forward amplifier output 275, while a seventh output path (via port 4) from the fourth output combiner 265, specifically a corresponding signal can be shed via second dump load 266. The signal corresponding to the sixth output path of combiner 265 also can be sampled via second loop output sampler 268, and the sampled signal can be operationally coupled to the pilot receiver 244 via the switch 242. The fourth gain/phase control 260 can be adjusted to minimize the pilot signal at the output of the second loop output sampler 268.

The first, second, third and fourth gain/phase controllers 210, 214, 232, 260 can be controlled by the first and second loop controllers 250 and 270. A signal output from first carrier detector 236 and the pilot receiver 244 can be input into the first loop controller 250. The first loop controller 250 can control the second and third gain/phase controls 214 and 232. A signal output from a second carrier detector 258 and the pilot receiver 244 can be input to the second loop controller 270. The second loop controller 270 can control the first and fourth gain/phase controls 210 and 260.

More particularly, in a dual loop feed forward linear power amplifier, one or more embodiments can provide that each error correction loop can be aligned to operate over a different frequency range, where the combined different frequency ranges correlate to the total operating bandwidth. Accordingly, one error correction loop can be aligned to cancel distortion products over the upper half of the feed forward linear power amplifier operating bandwidth, plus about an equal half band above the feed forward linear power amplifier operating bandwidth. The other error correction loop can be aligned to cancel distortion products over the lower half of the feed forward linear power amplifier operating bandwidth, plus an equal half band below the feed forward linear power amplifier operating bandwidth.

Reference is particularly made to the distortion cancellation alignment. In most cases, the carrier cancellation circuit ahead of each loop, e.g., the first and second gain phase controls 210, 214, can be aligned to cover the entire operating band of the feed forward linear power amplifier, in order to minimize the total output power required from the second and third amplifiers 234, 262 functioning as error correction or error amplifiers.

Illustrated in the exemplary embodiment of the feed forward amplifier of FIG. 2 is an exemplary location of the first detector 236 and the second detector 258. This advantageously can cause the first loop and second loops to be aligned to particular bandwidths, each covering a different frequency range. For example, components of the first loop 225–235 can be tuned to operate over a lower portion of the total operating band, and components of the second loop 255–265 can be tuned to operate over an upper portion of the total operating band.

Moreover, the first and second band pass filters 237, 257, can be inserted ahead of first and second detectors 236, 258, respectively, in each of the first and second feed forward loop carrier cancellation circuits. Advantageously, the pass band of each band pass filter can match the total net bandwidth of each of the loops, sometimes referred to as intermodulation ("IM") cancellation circuits, in order to optimize the carrier cancellation to match the IM cancellation circuit capabilities.

In accordance with one or more embodiments, the second and third amplifiers 234, 262 can be tuned to a pass band which closely matches the response of the corresponding band pass filter 237, 257, in order to avoid overdriving the second and third amplifiers 234, 262.

In accordance with alternative exemplary embodiments, in a situation where the first amplifier 216 experiences some gain roll-off at the edges of the overall operating band, a corresponding roll-off can be added to a response of each band pass filter 237, 257. Advantageously, in such a situation, the second and third amplifiers 234, 262 have a sufficient capability to restore the missing band-edge carrier power that the first amplifier 216 does not sufficiently provide.

In accordance with the exemplary embodiments, each loop controller can perform pilot cancellation over a frequency range covered by its respective loop. In the illustrated embodiments, the first and second loop controllers 250, 270 can perform pilot cancellation over the respective frequency ranges.

For example, the first loop controller 250 can adjust the third gain/phase control 232 when the controllable frequency oscillator 220 and the pilot receiver 244 are set on frequencies within the pass band of the components of the first loop 225–235. Similarly, the second loop controller 270 can adjust the fourth gain/phase control 260 when the controllable frequency oscillator 220 and the pilot receiver 244 are set on frequencies within the pass band of the components of the second loop 255–265.

Figure 3:
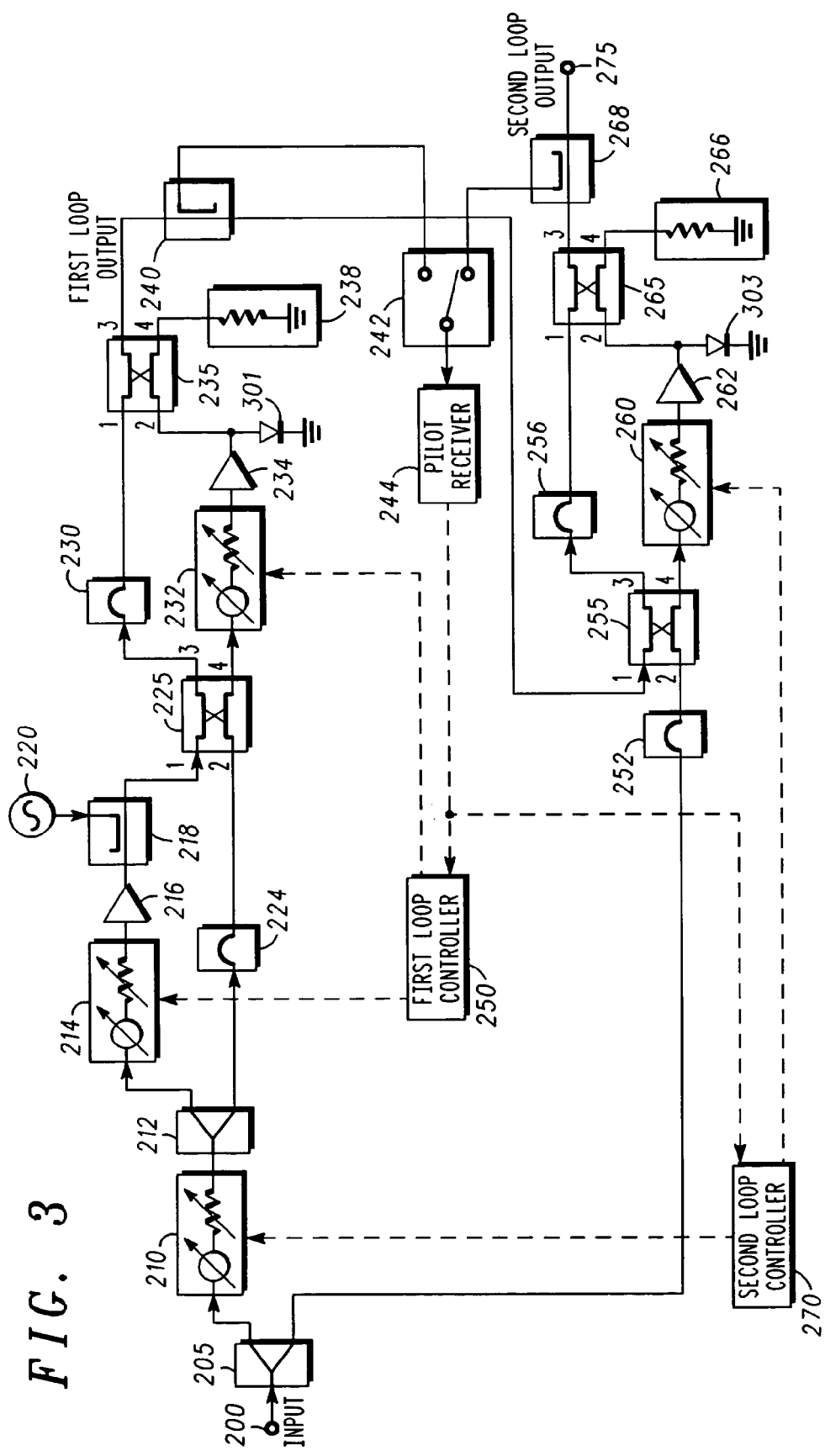
FIG. 3 is a block diagram illustrating an exemplary feed forward linear power amplifier in accordance with one or more alternative exemplary embodiments.

Referring now to FIG. 3, a diagram illustrating an exemplary feed forward linear power amplifier in accordance with a second exemplary embodiment will be discussed and described. A variant embodiment illustrated in FIG. 3, for example, includes positioning or locating the first and second detectors differently. In the present example, a second detector 301 can be positioned so that it measures the output of the second amplifier 234 (performing an error amplifier function), and a third detector 303 can be positioned so that it measures the output of the third amplifier 262 (performing an error amplifier function). For the sake of simplicity, the prior discussion of FIG. 2 is incorporated herein. However, it should also be noted that the band pass filters illustrated in FIG. 2 have been omitted in the exemplary alternative embodiment illustrated in FIG. 3.

Advantageously, in accordance with the example of FIG. 3, the band limiting in each loop can be primarily in the associated error amplifier.

Figure 4:
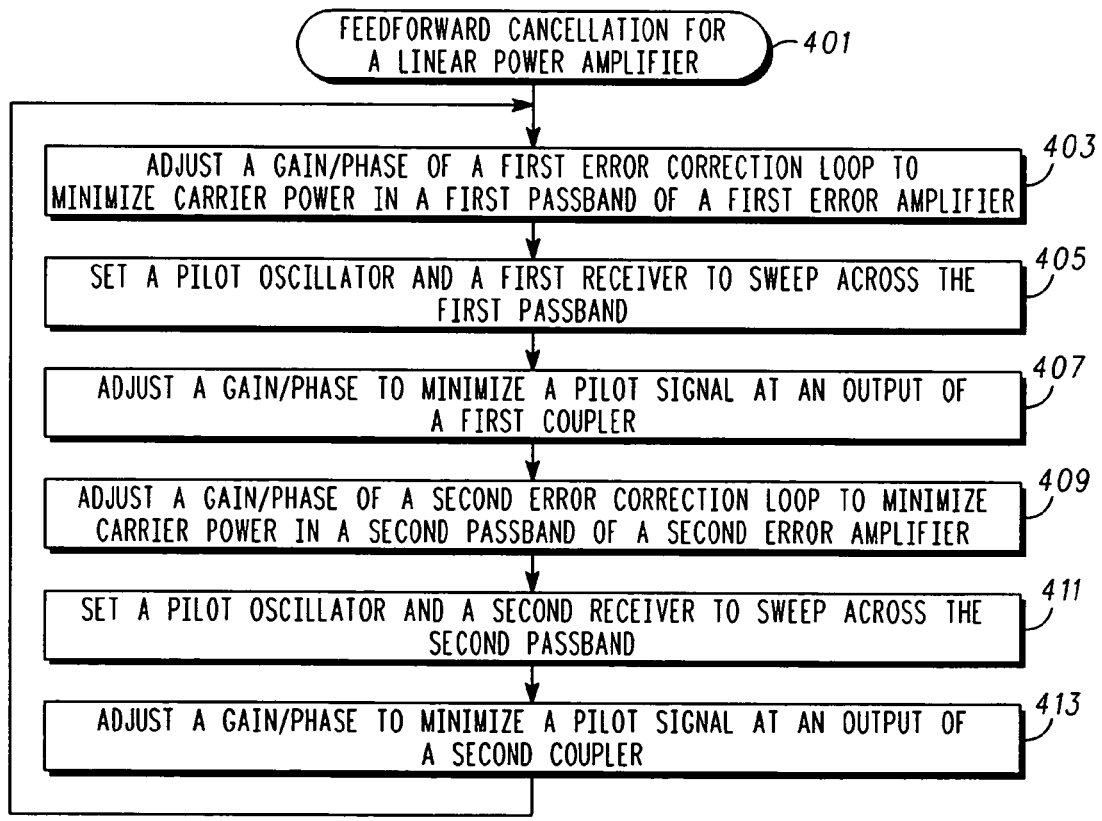
FIG. 4 is a flow chart illustrating an exemplary procedure for performing a feed forward cancellation for a linear power amplifier, in accordance with various exemplary and alternative exemplary embodiments.

Referring now to FIG. 4, a flow chart illustrating an exemplary procedure for performing a feed forward cancellation for a linear power amplifier 401 will be discussed and described. The procedure can advantageously be implemented in connection with, for example, a linear power amplifier, described in connection with FIG. 2, FIG. 3 or other apparatus appropriately arranged.

The process provides for adjusting 403 a gain/phase (e.g., the second gain/phase control 214 illustrated in FIG. 2) of a first error correction loop to minimize carrier power in a first pass band of a second amplifier 234, providing an error amplifier function, as described in detail above. The process further provides for setting 405 a pilot oscillator and a first or pilot receiver to sweep across the first pass band. Additionally, the process provides for adjusting 407 a gain/phase (e.g., the third gain/phase control 232 illustrated in FIG. 2) to minimize a pilot signal at an output of a first coupler.

Further, the process provides for adjusting 409 a gain/phase (e.g., the first gain/phase control 210 illustrated in FIG. 2) of a second error correction loop to minimize carrier power in a second pass band of a third amplifier 262 (providing an error amplifier function). The process further provides for setting 411 the pilot oscillator and a second or pilot receiver to sweep across the second pass band. Note that the pilot receivers or first and second receivers may in various embodiments be one pilot receiver and a corresponding switch arrangement such as the pilot receiver 244 and switch 242 or alternatively two separate receivers or pilot receivers. Additionally, the process provides for adjusting 413 a gain/phase (e.g., the fourth gain/phase control 260 illustrated in FIG. 2) to minimize a pilot signal at an output of second coupler.

Once the pilot oscillator has swept across the first and second pass bands, the process loops and repeats the foregoing 403–413. Hence, the controllable frequency oscillator can be configured to continuously sweep across the respective different frequency ranges. The foregoing discussion of the exemplary embodiments in connection with FIG. 2 and FIG. 3 can be referred to for details regarding the above process.

The process can provide for providing the pilot signal in accordance with the pilot oscillator. The pilot oscillator can be driven from an appropriate controller configured to provide an appropriately varying signal via a data stream that ultimately controls the pilot oscillator. As another example, the pilot oscillator can be a voltage controlled oscillator, e.g., with a phase lock loop. Advantageously, the voltage controlled oscillator can utilize control voltage ranges, each range corresponding to a range of each control loop.

The process can provide for aligning the first error correction loop and the second error correction loop to different frequency ranges. A detailed description has been previously provided, including examples of aligning loops to different frequency ranges.

In accordance with one or more embodiments, the foregoing process can be performed in connection with a base station.

One or more embodiments provide that the first error correction loop and the second error correction loop are tuned to different frequency ranges, and the different frequency ranges together cover at least one octave bandwidth. In exemplary embodiments, the total different frequency ranges can cover bandwidths of more than one octave, e.g., multi-octave frequency ranges.

In accordance with one or more embodiments, the process can include receiving an input signal and splitting the input signal into at least a first signal path and a second signal path. Also included in the process is inputting the first signal path into the first error correction loop and inputting the second signal path into the second error correction loop. The process further includes generating at least one signal from at least one of an output of the first error correction loop and an output of the second error correction loop.

Moreover, exemplary embodiments concern providing a base station with an ultra wideband feed forward linear power amplifier. Accordingly, a base station is provided, where the base station has a linear power amplifier. The linear power amplifier can include two or more error correction loops. The error correction loops can be tuned to respective different portions of a frequency range, as has been described in detail in the foregoing exemplary embodiments. Also, a pilot oscillator is provided, communicating with the error correction loops. The pilot oscillator can provide a pilot tone alternating between the different portions of the frequency range. Previous exemplary embodiments have discussed the pilot oscillator in detail.

In accordance with one or more embodiments, a signal to be amplified is provided to the linear power amplifier. Further, a signal can be generated from at least one of the error correction loops Moreover, one or more embodiments can provide that the different portions of the frequency range encompass a bandwidth of the linear power amplifier in operation.

Furthermore, the two or more error correction loops can include a band pass filter, as described for example in detail above. Advantageously, each pass band of each band pass filter can correspond to a total net bandwidth of the respective error correction loop.

In accordance with the foregoing disclosures, there have been described exemplary embodiments of a method and apparatus to perform feed forward error correction (e.g., distortion cancellation) over a bandwidth which exceeds the bandwidth of individual error correction paths. In the case of an octave bandwidth feed forward linear amplifier, one or more embodiments permit the utilization of octave bandwidth error correction paths, instead of necessitating a single error correction path having a bandwidth of two octaves.

This disclosure is intended to explain how to fashion and use various embodiments in accordance with the invention rather than to limit the true, intended, and fair scope and spirit thereof. The invention is defined solely by the appended claims, as they may be amended during the pendency of this application for patent, and all equivalents thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A circuit comprising:
    a feed forward linear power amplifier configured with a plurality of cascaded error correction loops, each error correction loop of the plurality of cascaded error correction loops having a band pass filter connected to a signal path input thereto, each band pass filter being tuned to a different frequency range; and
    a controller, configured to facilitate operation of the plurality of cascaded error correction loops.

2. The circuit of claim 1, further comprising a controllable frequency oscillator coupled to an input of the plurality of cascaded error correction loops.

3. The circuit of claim 1, wherein the different frequency ranges together cover at least one octave bandwidth.

4. The circuit of claim 1, wherein there are provided two error correction loops, and the band pass filter of each error correction loop is tuned to a different half of a bandwidth.

5. The circuit of claim 1, wherein the controllable frequency oscillator is configured to continuously sweep across the respective different frequency ranges.

6. The circuit of claim 1, further comprising at least one gain/phase control corresponding to each error control loop, to minimize a pilot signal from the controllable frequency oscillator.

7. The circuit of claim 1, wherein each bandpass filter is a fixed tuned filter.

8. The circuit of claim 1, further utilized in connection with a base station.

9. A method of performing a feed forward cancellation for a linear power amplifier, comprising:
    adjusting a gain/phase of a first error correction loop to minimize carrier power in a first passband of a first error amplifier;
    setting a pilot oscillator and a first receiver to sweep across the first passband;
    adjusting a gain/phase to minimize a pilot signal at an output of a first coupler;
    adjusting a gain/phase of a second error correction loop to minimize carrier power in a second passband of a second error amplifier;
    setting the pilot oscillator and a second receiver to sweep across the second passband; and
    adjusting a gain/phase to minimize a pilot signal at an output of a second coupler.

10. The method of claim 9, further comprising providing the pilot signal in accordance with the pilot oscillator.

11. The method of claim 9, further comprising aligning the first error correction loop and the second error correction loop to different frequency ranges.

12. The method of claim 9, wherein the steps are performed in a base station.

13. The method of claim 9, further comprising providing a linear passband amplifier having at least the first error correction loop and the second error correction loop.

14. The method of claim 9, wherein the first error correction loop and the second error correction loop are tuned to different frequency ranges, and the different frequency ranges together cover at least one octave bandwidth.

15. The method of claim 9, further comprising receiving an input signal and splitting the input signal into at least a first signal path and a second signal path; inputting the first signal path into the first error correction loop and inputting and the second signal path into the second error correction loop; and generating at least one signal from at least one of an output of the first error correction loop and an output of the second error correction loop.

16. A method of providing abase station with an ultra wideband feedforward linear power amplifier, comprising:
   providing a base station having a linear power amplifier, the linear power amplifier including at least two cascaded error correction loops, wherein the cascaded error correction loops are tuned to respective different portions of a frequency range; and
   providing a pilot oscillator communicating therewith, wherein the pilot oscillator provides a pilot tone alternating between the different portions of the frequency range.

17. The method of claim 16, further comprising providing a signal to be amplified to the linear power amplifier.

18. The method of claim 16, wherein the different portions of the frequency range encompass a bandwidth of the linear power amplifier in operation.

19. The method of claim 16, wherein the at least two cascaded error correction loops include a bandpass filter, wherein a passband of each bandpass filter corresponds to a total net bandwidth of the respective error correction loop.

20. The method of claim 16, further comprising generating a signal from at least one of the error correction loops.

* * * * *